United States Patent
Hashimoto

(10) Patent No.: US 6,255,839 B1
(45) Date of Patent: Jul. 3, 2001

(54) VOLTAGE APPLIED TYPE CURRENT MEASURING CIRCUIT IN AN IC TESTING APPARATUS

(75) Inventor: Yoshihiro Hashimoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/208,363

(22) Filed: Dec. 10, 1998

(30) Foreign Application Priority Data

Dec. 12, 1997 (JP) .................................................. 9-342835

(51) Int. Cl.$^7$ .................................................. G01R 31/26
(52) U.S. Cl. ...................... 324/765; 324/158.1; 324/763; 340/146.3
(58) Field of Search ................................. 324/765, 764, 324/763, 158.1, 537; 340/46.3

(56) References Cited

U.S. PATENT DOCUMENTS

| | | | |
|---|---|---|---|
| 5,500,588 | * 3/1996 | Worley | 324/158.1 |
| 5,543,728 | * 8/1996 | Grace et al. | 324/763 |
| 5,608,329 | * 3/1997 | Imamura | 324/537 |
| 5,696,773 | 12/1997 | Miller . | |
| 5,760,599 | * 6/1998 | Ehiro | 324/765 |

FOREIGN PATENT DOCUMENTS

| | | |
|---|---|---|
| 6273476 | 9/1994 | (JP) . |
| 6258382 | 9/1996 | (JP) . |
| WO9836340 | 8/1998 | (WO) . |

OTHER PUBLICATIONS

Patent Abstracts of Japan P–1737, May 13, 1994, vol. 18/No. 253: JP 06–034702 A.
Schrüfer, Elmar: Elektrische Messtechnik, 1$^{st}$ edition, Munich (et al): Hanser:Verlag, 1983, pp. 110–114.

* cited by examiner

Primary Examiner—Safet Metjahic
Assistant Examiner—Jimmy Nguyen
(74) Attorney, Agent, or Firm—Gallagher & Lathrop; David N. Lathrop

(57) ABSTRACT

An IC tester in which a voltage applied type current measuring circuit can be omitted is provided. A current detecting resistance element 21 is inserted into and in series with the output side of a driver 13 which is used in performing a function test for an IC, and a switch 41 is connected in parallel with the resistance element 21. In case of a function test, the switch 41 is turned on, and in case of measuring an input leakage current of a CMOS.IC 11, the switch 41 is turned off, and thereafter, switches 42 and 43 are sequentially turned on one after another to detect a voltage at each end of the resistance element 21 by an analog-to-digital converter 45. This procedure is performed for each of I/O blocks 12-1 to 12-n corresponding to pins of the CMOS.IC, and then, the difference between the detected voltages at the both ends of the resistance element 21 in each block is taken to find the presence/absence and/or the magnitude of the input leakage current.

9 Claims, 3 Drawing Sheets

VOLTAGE APPLIED TYPE CURRENT MEASURING CIRCUIT IN AN IC TESTING APPARATUS

BACKGROUND OF THE INVENTION

1. Field of the Invention

The present invention relates to an IC testing apparatus (commonly called IC tester) for testing a semiconductor integrated circuit (hereinafter referred to as IC), and more particularly, to a voltage applied type current measuring circuit utilized in testing a logic IC formed by, for example, a CMOS or CMOSs (Complementary Metal Oxide Semiconductor or Semiconductors) to determine whether a leakage current flows or not through input terminal pins of the logic IC (hereinafter referred to as CMOS.IC). Herein, the voltage applied type current measuring circuit means a circuit for applying a voltage to an IC under test and measuring a current flow through the IC.

2. Description of the Related Art

In an IC tester, a function test for applying a varying voltage to an IC under test (commonly called DUT) and measuring in what manner the output of the IC under test is varied can be performed at high speed for each input terminal pin of the IC under test.

A feature of the CMOS.IC which is one of various types of ICs is such that its input current is small or zero, but a circuit for measuring a minute or micro current is needed to test such CMOS.IC. However, such micro current measuring circuit is usually slow in response, and hence it is customary in the prior art that the measurement of current through a CMOS.IC is conducted separately of the function test thereof. FIG. 3 shows an example of an associated circuit part of a conventional IC tester having a voltage applied type current measuring circuit for measuring a minute or micro current through an IC under test.

There are provided, for each of pins of an IC under test (DUT) 11, a plurality of input/output blocks 12-1, 12-2, . . . , 12-n (n being an integer equal to the number of the pins of the IC under test and equal to or greater than one). Each input/output block (I/O block) comprises a driver 13 for applying a predetermined voltage to corresponding one of the pins of the IC under test 11, a comparator 16 for comparing an output voltage from the IC under test 11 with a reference voltage, and a voltage applied type current measuring circuit 17.

The output terminal of the driver 13 is connected to an input/output terminal 15 of that I/O block via a first switch 14, and the connection point (junction) of the output terminal of the driver 13 and the first switch 14 is connected to an input terminal of the comparator 16.

The voltage applied type current measuring circuit 17 comprises a digital-to-analog converter (D/A converter) 18, a buffer circuit 19 having its non-inverting input terminal connected to the output terminal of the D/A converter 18, a differential amplifier 23 having its inverting input terminal connected to the output terminal of the buffer circuit 19 and its non-inverting terminal connected to the output terminal of the D/A converter 18, and a current detecting resistance element 21 the input side of which is connected to the output terminal of the buffer circuit 19 and the output side of which is connected to the inverting input terminal of the buffer circuit 19 and one end of a second switch 22. Accordingly, the output terminal of the buffer circuit 19 is connected to the input/output terminal 15 of that I/O block via the current detecting resistance element 21 and the second switch 22 in series.

The output terminal of the differential amplifier 23 in each I/O block 12-i (i=1, 2, . . . , n) is connected to an analog-to-digital converter (AD converter) 25 via a switch 24-i (i=1, 2, . . . , n) provided in each of the I/O blocks. Further, an operating power supply 26 is connected to a power supply terminal pin of the IC under test 11.

In case of measuring a current flow through an IC under test under a predetermined voltage applied thereto, namely, in case of the voltage applied type current measurement, each of the input/output terminals of the I/O blocks 12-1 to 12-n is connected to corresponding one of the pins of the IC under test 11, a digital value set in correspondence to a testing voltage is inputted into the D/A converter 18 under the condition that the first switch 14 and the second switch 22 in each I/O block are turned off and on respectively, and then a testing voltage outputted from the D/A converter 18 is applied to each of the pins of the IC under test 11.

By this procedure, a voltage developed across the current detecting resistance element 21 in correspondence to a current flow through each pin of the IC under test 11 can be detected by the differential amplifier 23 constructed as stated below, and therefore, by sequentially turning on the switches 24-1 to 24-n one after another, a voltage corresponding to an input current flow into each I/O block which has been turned on, that is, to an input current flow into each pin of the IC under test 11 connected to that I/O block which has been turned on can be obtained from the A/D converter 25 as digital data.

The differential amplifier 23 actually has such a circuit construction, as shown in FIG. 4, that the inverting input terminal 27 thereof is connected to a non-inverting input terminal of a buffer 28, an output terminal of the buffer 28 is connected to an inverting input terminal thereof as well as to an inverting input terminal of a differential amplifier 31 via a first resistance element 29 (R1), a second resistance element 35 (R2) is connected between an inverting input terminal and an output terminal of the differential amplifier 31, the non-inverting input terminal 32 of the differential amplifier 23 is connected to a non-inverting input terminal of the differential amplifier 31 via a third resistance element 33 (R3), this non-inverting input terminal of the differential amplifier 31 is connected to the ground via a fourth resistance element 34 (R4), and an output element of the differential amplifier 31 is connected to the output terminal 36 of the differential amplifier 23. Accordingly, to the output terminal 36 of the differential amplifier 23 is outputted a difference voltage $V_C$ between the voltage $V_A$ at the inverting input terminal 27 and the voltage $V_B$ at the non-inverting input terminal 32, and a voltage corresponding to an input current flow into each pin of the IC under test 11 can be obtained from the A/D converter 25 as digital data.

The differential amplifier 23 must be designed by taking into consideration a common-mode rejection ratio (CMRR), that is, a characteristic of rate or ratio where signals inputted into the two input terminals 27 and 32 in phase with each other are rejected. If this common-mode rejection ratio is inappropriate, it is difficult to measure an input current with high accuracy. The common-mode rejection ratio is affected by errors in the resistance values of the resistance elements 29, 33, 34 and 35.

Letting the resistance values of the resistance elements 29, 35, 33 and 34 be represented by R1, R2, R3 and R4, respectively, and assuming that the resistance value of each of the resistance elements has an error α, the relationship between voltage $V_A$ at the inverting input terminal 27, voltage $V_B$ at the non-inverting input terminal 32, and voltage $V_C$ at the output terminal 36 can be expressed by the following equation.

$$V_C = V_A \cdot \frac{R2}{R1} - V_B \cdot \frac{R4}{R3+R4} \cdot \frac{R1+R2}{R1}$$

Therefore, putting $R1=R(1\pm\alpha)$, $R2=R(1\mp\alpha)$, $R3=R(1\mp\alpha)$, $R4=R(1\pm\alpha)$, $V_A=V_B$, then $V_C=4\alpha$. For example, assuming that $V_B=5$ V and $\alpha=0.1\%$, the error is $50\times0.1\%\times4=20$ mV at the maximum.

Since such a large error occurs, the minute current measurement requires to use the resistance elements 29, 33, 34 and 35 having extremely high-precision resistance values, respectively, which are very expensive resistance elements. In addition, it is necessary to correct errors in the operational amplifiers (buffers) and the A/D converter.

SUMMARY OF THE INVENTION

It is therefore an object of the present invention to provide a voltage applied type current measuring circuit in an IC testing apparatus which can correctly measure a minute or micro current flow through an IC without need to use any differential amplifier which is necessary to use resistance elements having extremely high-precision resistance values.

It is an another object of the present invention to provide a voltage applied type current measuring circuit in an IC testing apparatus which need not correct any error in an operational amplifier and/or an A/D converter.

In order to accomplish the above objects, in an aspect of the present invention, there is provided a voltage applied type current measuring circuit in an IC testing apparatus which comprises: a current detecting resistance element inserted into and in series with the output side of a driver for applying a test pattern to a terminal of an IC element under test; a first switching means connected across the current detecting resistance element; an analog-to-digital converter means for converting an input voltage value into digital data; second and third switching means connected between one end of the current detecting resistance element and the input terminal of the analog-to-digital converter means, and the other end of the current detecting resistance element and the input terminal of the analog-to-digital converter means, respectively; and control means for turning off the first switching means to apply a voltage from the driver to the IC element under test through the current detecting resistance element, turning on the second switching means as well as turning off the third switching means to obtain output data from the analog-to-digital converter means, turning off the second switching means as well as turning on the third switching means to obtain output data from the analog-to-digital converter means, and finding the difference between both the output data to obtain a current flow through the current detecting resistance element.

The driver, the current detecting resistance element, the first, second and third switching means are provided for each of the terminals of the IC element under test, and the analog-to-digital converter means is connected in common to all of the second and third switching means provided for each of the terminals of the IC element.

In a preferred embodiment, the driver, the current detecting resistance element, the first, second and third switching means are provided as an input/output block for each of the terminals of the IC element under test, and the analog-to-digital converter means is provided the only one in common to all of the input/output blocks. In addition, a plurality of block selection switching means are provided each of which is connected between the second and third switching means in each input/output block and the analog-to-digital converter means.

The control means generates control signals for controlling to turn on/off the first, second and third switching means as well as controlling to turn on/off the block selection switching means on the basis of control signals supplied from a pattern generator.

A memory for storing output data of the analog-to-digital converter means is provided, and the difference between both the output data is found from the data read out of this memory.

According to the present invention, a current detecting resistance element is inserted into and in series with the output side of a driver for applying a test pattern to an IC element under test in a function test, and a first switching means is connected across the current detecting resistance element, and in case of performing a usual function test, the current detecting resistance element is short-circuited by the first switching means, whereas in case of measuring a minute or micro current flowing into an IC element under test, for example, measuring presence/absence of any input leakage current flowing through a CMOS device and/or the magnitude of the leakage current, the first switching means is turned off, and voltages at both ends of the current detecting resistance element are sequentially supplied via second and third switching means to an analog-to-digital converter means respectively to measure the respective voltage values. A current flow through the current detecting resistance element, that is, an input minute current flowing through the IC element under test can be found from the difference between the measured both voltage values.

DETAILED DESCRIPTION OF THE PREFERRED EMBODIMENTS

Now, an embodiment of the present invention will be described in detail with reference to FIGS. 1 and 2.

Figure 1:
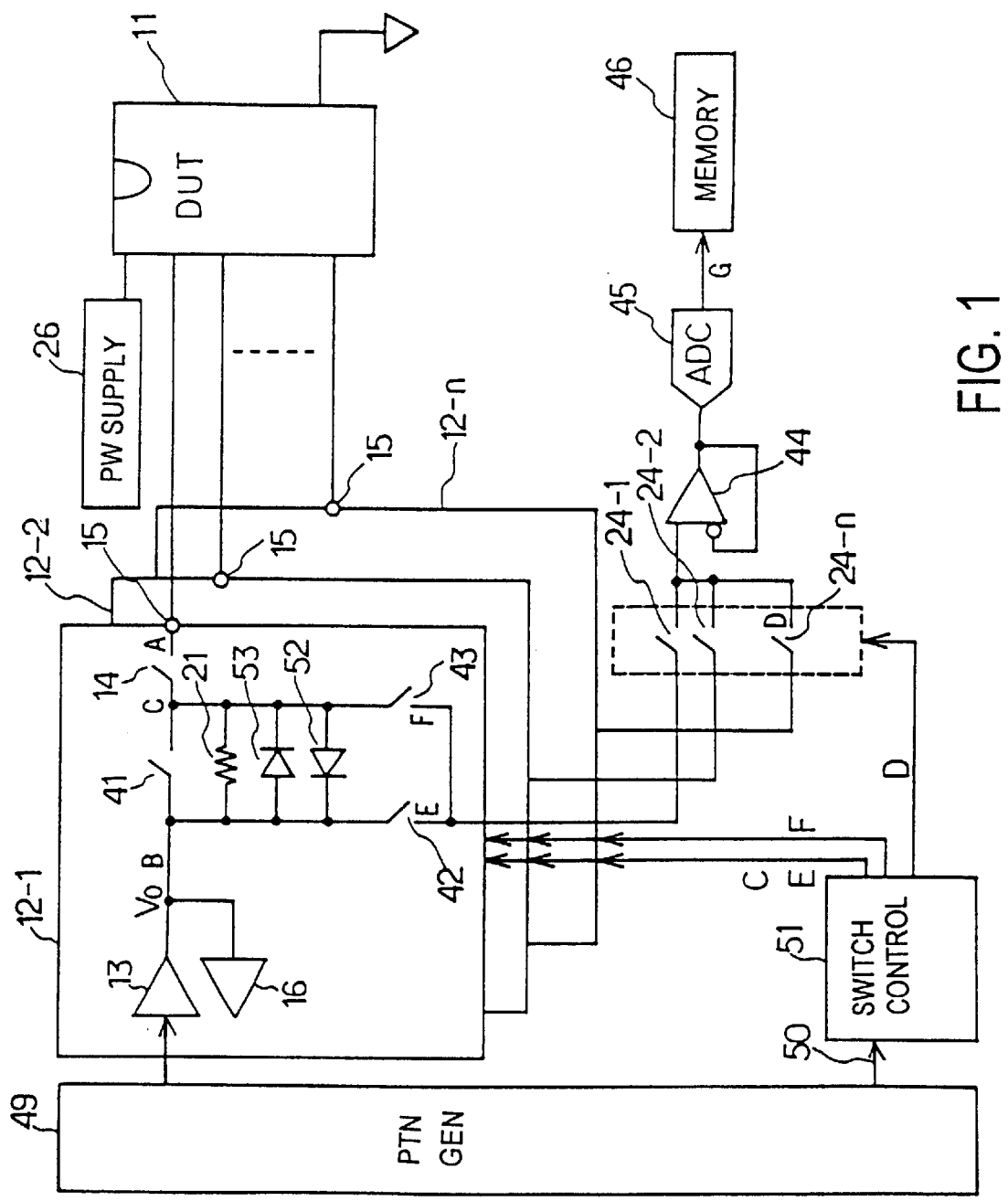
FIG. 1 is a block diagram showing an associated circuit part of an IC tester having a voltage applied type current measuring circuit according to the present invention.
Figure 2:
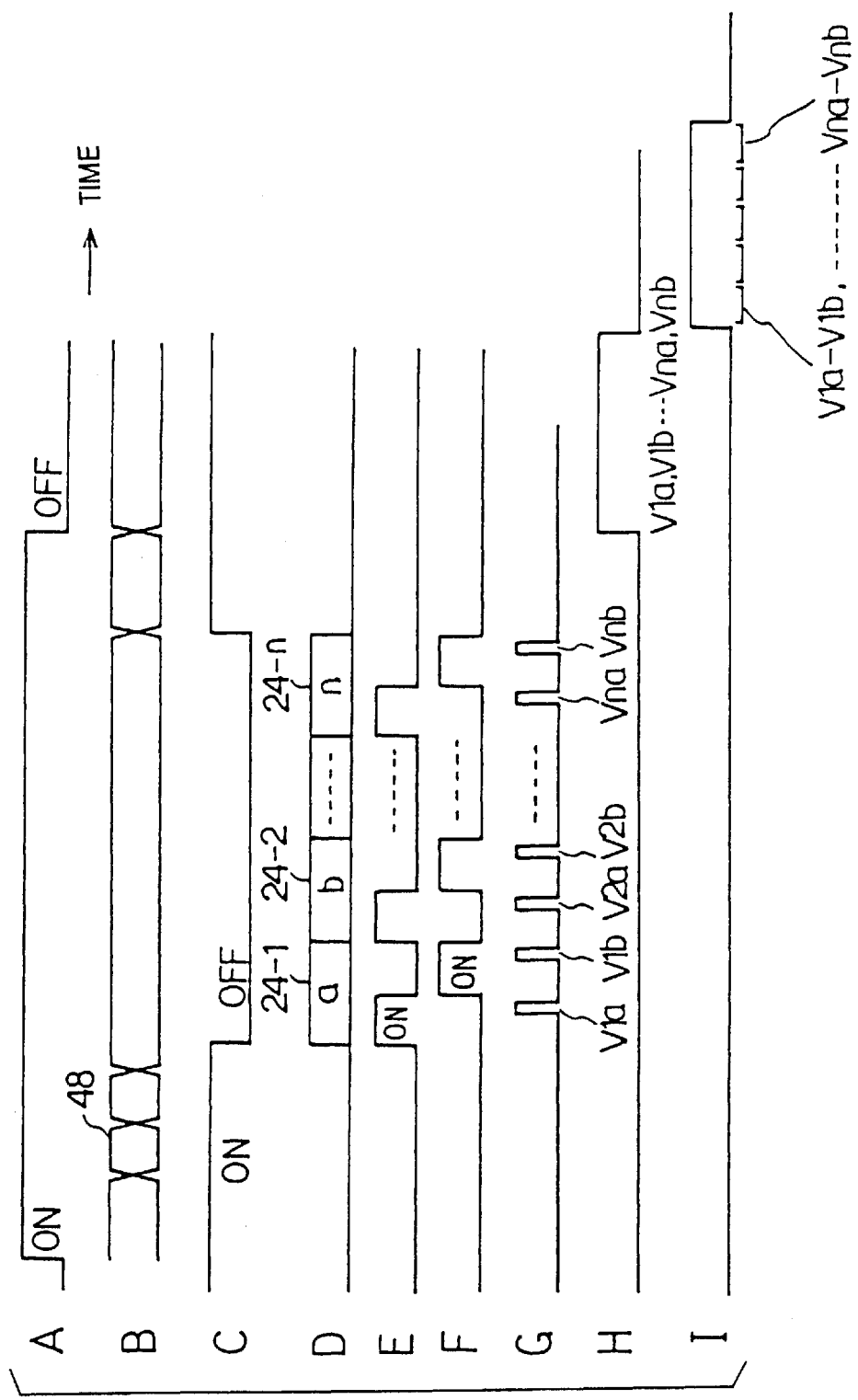
FIG. 2 is a timing chart for explaining the operation of the voltage applied type current measuring circuit shown in FIG. 1.
Figure 3:
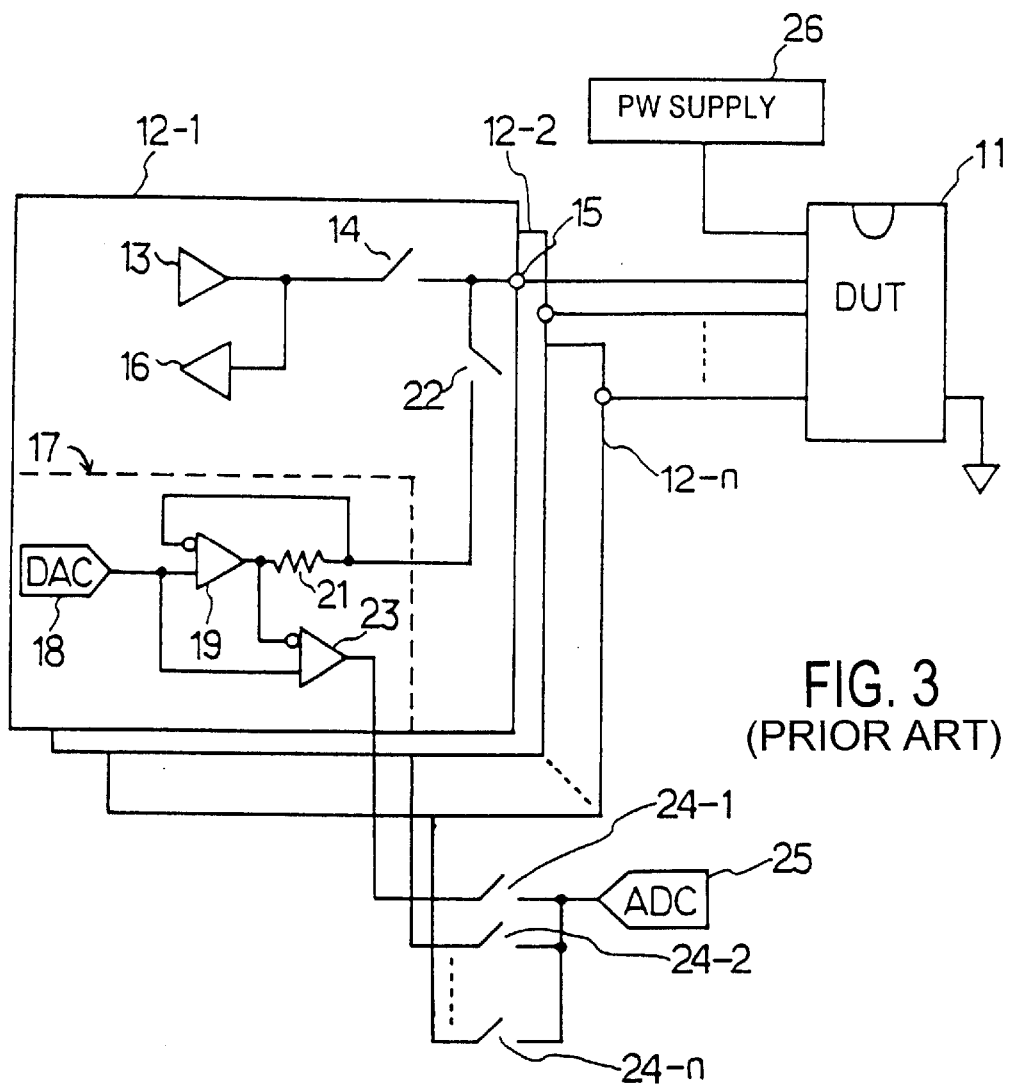
FIG. 3 is a block diagram showing an associated circuit part of a conventional IC tester having a voltage applied type current measuring circuit.

FIG. 1 is a block diagram showing an associated circuit part of an IC tester having a voltage applied type current measuring circuit according to the present invention. Further, the portions or elements in FIG. 1 corresponding to those in FIG. 3 are shown by affixing thereto the same reference characters as those in FIG. 3 and the explanation thereof will be omitted unless necessary.

In this embodiment, there are provided, for each of pins of an IC under test (DUT) 11, a plurality of input/output blocks 12-1, 12-2, ..., 12-n (n being an integer equal to the number of the pins of the IC under test and equal to or greater than one). Each input/output block (I/O block) comprises a driver 13 for applying a predetermined voltage to corresponding one of the pins of the IC under test 11 through a first switch 14 and an input/output terminal 15, a comparator 16 for comparing an output voltage from the IC under test 11 with a reference voltage, and a current detecting resistance element 21 connected in series between the output terminal of the driver 13 and the first switch 14.

Moreover, a third switch 41 is connected across the current detecting resistance element 21, a fourth switch 42 is connected between one end of a block selection switch 24-i (i=1, 2, ..., n) provided for each I/O block and the input side of the current detecting resistance element 21, and a fifth switch is connected between the one end of a block selection switch 24-i and the output side of the current detecting resistance element 21.

Accordingly, the output terminal of the driver 13 in each I/O block is, in this embodiment, connected to the input/output terminal 15 of that I/O block via the third switch 41 or the current detecting resistance element 21 and the first switch 14 in series, and the connection point (junction) of the output terminal of the driver 13 and the third switch 41 is connected to an input terminal of the comparator 16.

Each of the other ends of the block selection switches 24-1 to 24-n is connected to the input terminal of an analog-to-digital converter (A/D converter) 45 via a buffer circuit 44, and the output terminal of the A/D converter 45 is connected to a data memory 46 to store digital data outputted from the A/D converter 45 therein. The buffer circuit 44 has its non-inverting input terminal connected to all of the other ends of the block selection switches 24-1 to 24-n and its inverting input terminal connected to its output terminal.

In addition, there is provided a switch control circuit 51 which generates control signals C, E and F for controlling to turn on/off the third, fourth and fifth switches 41, 42 and 43 in each I/O block 12-i, respectively, and a control signal D for controlling to turn on/off each block selection switch 24-i. This switch control circuit 51 generates these control signals C, D, E and F as shown in FIGS. 2C, 2D, 2E and 2F in response to control signals 50 supplied from a pattern generator (PTN GEN) 49.

Now, the operation of the IC tester constructed as discussed above will be described.

The output voltage $V_O$ outputted from the driver 13 in response to a predetermined test pattern supplied from the pattern generator 49 can be changed to a value having an arbitrary magnitude within the range of a required test, and also a test pattern of the set voltage can be applied to the IC under test 11.

First, in case of performing a function test for the IC under test 11, the output voltage $V_O$ of the driver 13 is set to become a required value, and in this condition, the first switch 14 is turned on as shown in FIG. 2A, the third switch 41 is turned on as shown in FIG. 2C, and the fourth and fifth switches 42 and 43 are turned off as shown in FIGS. 2E and 2F. Thereafter, a test pattern 48 is outputted from the driver 13 as shown in FIG. 2B to supply it to the IC under test 11, thereby conducting the function test therefor.

Next, in case of measuring a minute or micro current flowing through an IC under test 11, for example, measuring an input minute or micro current or input leakage current flowing through an IC under test 11 constituted by a CMOS device, as shown in FIG. 2C, the third switch 41 is turned off and the pattern generator 49 is put in a quiescent or loop state whereby the set voltage $V_O$ is continuously outputted from the driver 13.

In this condition, at first, as shown in FIG. 2D, the block selection switch 24-1 is turned on, and only for the first half of this turn-on time period of the switch 24-1, the fourth switch 42 is turned on as shown in FIG. 2E and only for the latter half of this turn-on time period of the switch 24-1, the fifth switch 43 is turned on as shown in FIG. 2F. That is, voltages at both ends of the current detecting resistance element 21 in the block 12-1 are supplied, namely, a voltage at the input side terminal of the resistance element 21 in the first half and a voltage at the output side terminal thereof in the latter half of the turn-on time period are supplied, to the A/D converter 45 where they are converted into digital data V1a and V1b as shown in FIG. 2G. The converted digital data V1a and V1b are sent to and stored in the data memory 46.

Next, the block selection switch 24-2 is turned on, and then voltages at both ends of the current detecting resistance element 21 in the block 12-2 are taken or stored in the data memory 46 as digital data V2a and V2b, respectively. Similarly, the block selection switch 24-i is turned on. and then voltages at both ends of the current detecting resistance elements 21 in the block 12-i are taken or stored in the data memory 46 as digital data Via and Vib, respectively. Finally, the block selection switch 24-n is turned on, and then voltages at both ends of the current detecting resistance elements 21 in the block 12-n are taken or stored in the data memory 46 as digital data Vna and Vnb, respectively.

Upon completion of conversion of the voltages at both ends of each of the current detecting resistance elements 21 in all of the blocks 12-1 to 12-n into digital data and storage of the digital data in the data memory 46 as discussed above, the third switch 41 is turned on as shown in FIG. 2C, and subsequently, the first switch 14 is turned off as shown in FIG. 2A. Thereafter, the stored digital data in the data memory 46 are read out therefrom (FIG. 2H), and then differences V1a–V1b, ..., Vna–Vnb between the voltages at the both ends of the respective current detecting resistance elements 21 in the I/O blocks 21-1 to 21-n are found as shown in FIG. 2I. By this procedure, there are obtained current values each corresponding to a value of current having flowed through each of the respective current detecting resistance elements 21, i.e., a value of input current flow (a value of input leakage current) through each of the respective pins of the IC under test 11. These values V1a–V1b, ..., Vna–Vnb themselves are outputted as test results. Alternatively, whether each of the values V1a–V1b, ..., Vna–Vnb is equal to or smaller than a predetermined value, that is, the presence or absence of the input leakage current for each pin, may be outputted as test results.

In the above embodiment, the on/off control for the respective switches stated above is conducted by controlling the switch control circuit 51 by control signals 50 from the pattern generator 49, thereby to generate control signals as shown in FIGS. 2C, 2D, 2E and 2F. However, it is needless to say that the switch control circuit 51 may be controlled by any another control means.

Further, when a voltage drop in the current detecting resistance element 21 is so large that the IC under test 11 is not likely to operate normally, a pair of diodes 52 and 53 having opposite polarities with each other are connected in parallel with the current detecting resistance element 21 to keep the voltage drop the reacross at a fixed value, as shown in FIG. 1. In this case, however, the input current value flowing through the IC under test 11 cannot be measured, but it is possible to determine whether the input leakage current is present or not in the IC under test 11.

Figure 4:
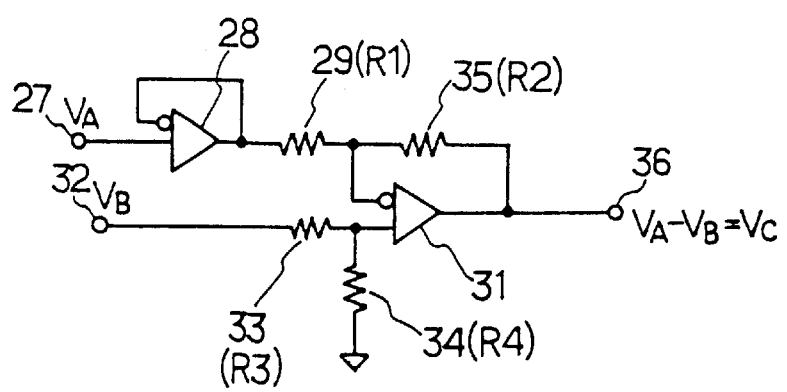
FIG. 4 is a circuit diagram showing a schematic circuit of the differential amplifier 23 shown in FIG. 3.

As described above, according to the present invention, unlike the prior art IC tester, the system of generating a voltage applied to an IC under test need not include the operational amplifier (buffer) 19 (FIG. 3) which is the cause of an error. Furthermore, the present invention does not use the differential amplifier 23 (FIG. 4) to detect a voltage across the current detecting resistance element 21, and hence it is not feared that any error in the common-mode rejection ratio occurs.

In addition, since the A/D converter 45 only converts voltages at both ends of each current detecting resistance element into digital data (difference between the voltages at the both ends is calculated after the digital data are read out of a memory), it needs only to have a sufficient linearity in its conversion characteristic and need not be subjected to correction for an error. Accordingly, its fixed error does not matter.

Moreover, an output voltage $V_O$ set in a function test for an IC under test is also used intact in a measurement of minute or micro current through the IC under test, and hence no particular setup is needed therefor.

As previously described, since the differential amplifier 23 is not used in the present invention, expensive parts or elements having very high-precision are unnecessary for each pin (each block), which results in manufacture of the voltage applied type current measuring circuit at fairly low cost and in small size as a whole.

It will be apparent to those skilled in the art that many modifications and variations of the present invention may be effected without departing from the scope of the novel concepts of the present invention.

What is claimed is:

1. A voltage applied type current measuring circuit in an IC testing apparatus comprising:
    a current detecting resistance element inserted into and in series with the output side of a driver for applying a test pattern to a terminal of an IC element under test;
    a first switching means connected across said current detecting resistance element;
    an analog-to-digital converter means for converting an input voltage value into digital data;
    second and third switching means connected between one end of said current detecting resistance element and the input terminal of said analog-to-digital converter means, and the other end of said current detecting resistance element and the input terminal of said analog-to-digital converter means, respectively; and
    control means for turning off said first switching means to apply a voltage from the driver to the IC element under test through said current detecting resistance element, turning on said second switching means as well as turning off said third switching means to obtain output data from the analog-to-digital converter means, turning off said second switching means as well as turning on said third switching means to obtain output data from the analog-to-digital converter means, and finding the difference between both said output data to obtain a current flow through said current detecting resistance element.

2. The voltage applied type current measuring circuit as recited in claim 1, wherein said driver, said current detecting resistance element, said first, second and third switching means are provided for each of the terminals of the IC element under test, and said analog-to-digital converter means is connected in common to all of the second and third switching means provided for each of the terminals of the IC element.

3. The voltage applied type current measuring circuit as recited in claim 1, wherein said driver, said current detecting resistance element, said first, second and third switching means are provided as an input/output block for each of the terminals of the IC element under test, and said analog-to-digital converter means is provided the only one in common to all of the input/output blocks.

4. The voltage applied type current measuring circuit as recited in claim 2, further comprising a plurality of terminal selection switching means each being connected between the second and third switching means for each terminal and said analog-to-digital converter means.

5. The voltage applied type current measuring circuit as recited in claim 3, further comprising a plurality of block selection switching means each being connected between the second and third switching means in each input/output block and said analog-to-digital converter means.

6. The voltage applied type current measuring circuit as recited in claim 1, wherein said control means generates control signals for controlling to turn on/off the first, second and third switching means on the basis of control signals supplied from a pattern generator.

7. The voltage applied type current measuring circuit as recited in claim 4, wherein said control means generates control signals for controlling to turn on/off the first, second and third switching means as well as controlling to turn on/off the terminal selection switching means on the basis of control signals supplied from a pattern generator.

8. The voltage applied type current measuring circuit as recited in claim 5, wherein said control means generates control signals for controlling to turn on/off the first, second and third switching means as well as controlling to turn on/off the block selection switching means on the basis of control signals supplied from a pattern generator.

9. The voltage applied type current measuring circuit as recited in claim 1, further comprising a memory for storing output data of said analog-to-digital converter means, and wherein said difference between both the output data is found from the data read out of said memory.

* * * * *